(12) United States Patent
Tippens (10) Patent No.: US 11,477,840 B2
(45) Date of Patent: Oct. 18, 2022

(54) VARIABLE PULSE ENCODING COMMUNICATIONS PROTOCOL

(71) Applicant: Kennesaw State University Research and Service Foundation, Inc., Kennesaw, GA (US)

(72) Inventor: Scott Tippens, Powder Springs, GA (US)

(73) Assignee: Kennesaw State University Research And Service Foundation, Inc., Kennesaw, GA (US)

( * ) Notice: Subject to any disclaimer, the term of this patent is extended or adjusted under 35 U.S.C. 154(b) by 36 days.

(21) Appl. No.: 17/112,361

(22) Filed: Dec. 4, 2020

(65) Prior Publication Data

US 2021/0176812 A1 Jun. 10, 2021

Related U.S. Application Data

(60) Provisional application No. 62/944,072, filed on Dec. 5, 2019.

(51) Int. Cl.
*H03M 5/08* (2006.01)
*H03M 7/30* (2006.01)
*H04W 76/20* (2018.01)

(52) U.S. Cl.
CPC ............. *H04W 76/20* (2018.02); *H03M 5/08* (2013.01); *H03M 7/30* (2013.01)

(58) Field of Classification Search
CPC ....... H03M 5/08; H03M 7/30; H04L 25/4902; H04W 76/20
USPC .................................................. 341/160–182
See application file for complete search history.

(56) References Cited

U.S. PATENT DOCUMENTS

| 5,969,631 | A | * | 10/1999 | Ammler | H04L 25/4902 375/364 |
| 10,924,312 | B1 | * | 2/2021 | Liu | H04L 27/156 |
| 2004/0101060 | A1 | * | 5/2004 | Simon | H04L 25/085 375/257 |
| 2009/0134948 | A1 | | 5/2009 | Miwa | |
| 2019/0215137 | A1 | * | 7/2019 | Wiley | G06F 13/4018 |

FOREIGN PATENT DOCUMENTS

EP 1983709 A1 10/2008

* cited by examiner

*Primary Examiner* — Lam T Mai
(74) *Attorney, Agent, or Firm* — Smith, Gambrell & Russell LLP (57) ABSTRACT

A method for transmitting information using a pulse may comprise transmitting, via a channel between a first device and a second device, an idle state for an idle time; and transmitting, via the channel, a pulse state for a pulse time, wherein the idle time and the pulse time define a value for a data word being transmitted, and wherein the duration of one or more of the idle time and the pulse time vary depending upon the value of the data word.

18 Claims, 5 Drawing Sheets

VARIABLE PULSE ENCODING COMMUNICATIONS PROTOCOL

CROSS REFERENCE TO RELATED APPLICATIONS

This application claims priority to and the benefit of U.S. Ser. No. 62/944,072 filed Dec. 5, 2019, which is expressly incorporated by reference herein in its entirety.

BACKGROUND

Device-to-device communication may occur using serial peripheral interface (SPI) and/or inter-integrated circuit (I2C or I²C) protocols.

As an example, U.S. Pat. Pub. No. 2009/0134948 to Miwa describes a pulse modulation method that divides code comprising 4N-bit data into 2-bit units of data. For each pulse signal having a fixed pulse width $t_w$, a code modulated signal is generated by pausing between pulse pause intervals Tr. An adjusted time width of between ½ and 1 times the fixed pulse width $t_w$ is taken to be $\Delta t$. One of time widths 0, $\Delta t$, $2\Delta t$, and $3\Delta t$ is added to a fixed pause period $t_m$ of time intervals according to a corresponding value of the 2-bit data. If the sum total time TD of the code modulated signal is an interval of at least $[(2t_w+2t_m+3\Delta t)N+\Delta t]$, each pulse pause interval Tr is substituted by a pulse pause interval Tr corresponding to the inverted 2-bit data. An inversion flag signal expresses that inversion information is added to the code modulated signal.

An object of Miwa's invention is to provide a pulse modulation method that shortens the transmission period of the code comprising multiple bit data, and to make possible reliable demodulation even when pulse jitter is produced based on the transmission environment. In order to improve in transmission speed, Miwa's invention provides a pulse modulation method that divides code comprising 4N-bit data (N is a positive integer) into units configured by every 2 bits of data. After a pulse signal of a fixed pulse width $t_w$ has been generated, Miwa generates for each unit a code modulated signal by pausing between pulse pause intervals for a pulse signal that has been set corresponding to value of the 2-bit data of that unit. Then Miwa's protocol connects the code modulated signals for all units.

Improvements are needed.

SUMMARY

The present disclosure relates to a data protocol. Challenges in the prior art include issues when increasing transmission speed. Such issues may be due to large transmission overheads for clock signals, handshake signals, and the like. Alternatively or additionally, issues may be experienced when dividing up the data into transmission groups, which requires overhead, or portions of the signal which do not contain message information. One or more of these issues may be addressed by the present disclosure.

A system for transmitting data is presented. The system may comprise a transmitter, a receiver, a channel connecting the transmitter and the receiver, and a data protocol. The data protocol may comprise an idle time duration, a pulse time duration defining a fundamental time length, a data word or words, a frame start signal and a word start signal.

A method for transmitting information is presented. The method comprises sending a signal from a transmitter to a receiver wherein the signal comprises an idle period of time, a pulse duration defining a fundamental time length, a frame start signal, a word start signal, and at least one data word signal.

A data protocol may comprise a single pulse representing a group of bits (e.g., 2 or more bits, 4 bits, 5 bits, etc.), wherein the information contained within the pulse is represented by the width of the pulse when it is in the high state and the time the signal is in the idle state prior to the start of the pulse.

A method for transmitting information using a pulse is disclosed. The method may comprise causing an idle state for a select idle time; and causing a high or pulse state for a select pulse time, wherein the idle time and the pulse time may define a value for a bit of information being transmitted.

A data frame may comprise a pulse sequence indicative of a frame start; one or more data words following the frame start; and a pulse sequence indicating a start to the subsequent frame. The start of the subsequent frame may operate as an end frame to the preceding sequence.

A data frame may comprise a pulse sequence indicative of a frame start; one or more data words separated by word separator pulses following the frame start; and a pulse sequence indicating a start to the subsequent frame.

BRIEF DESCRIPTION OF THE DRAWINGS

The following drawings show generally, by way of example, but not by way of limitation, various examples discussed in the present disclosure. In the drawings.

DETAILED DESCRIPTION

The present disclosure relates to systems and methods for transmitting data. A system may comprise a transmitter, a receiver, at least one channel connecting the transmitter and the receiver, a data protocol configured to control transmission of data from the transmitter to the receiver, wherein the data protocol comprises: an idle time duration, a pulse time duration defining a fundamental time length, at least one data word encoded by an idle time and a pulse time, a signal indicating a frame start, and a signal indicating a word start.

The present disclosure relates to systems and methods for transmitting digital information comprising: sending a signal from a transmitter to a receiver, wherein the signal comprises: an idle period of time; a pulse duration defining a fundamental time length; a frame start signal; a word start signal; and a data word signal.

The present disclosure further relates to systems and methods for digital information comprising: transmitting, via a channel between a first device and a second device, an idle state for a select idle time; and transmitting, via the channel, a pulse state for a select pulse time. The select idle time and the select pulse time define a value for a data word being transmitted. A duration of one or more of the select idle time and the select pulse time may vary depending upon the value of the data word.

A pulse may comprise a signal which has a rapid transient change in amplitude from a baseline value to a higher value followed by a return to the baseline value. A pulse therefore may comprise a high or active state and a low or idle state. The high state may be called the pulse and may have a time duration (e.g., referred to as pulse width or pulse length or pulse time). A pulse may indicate a high state. An idle period may indicate a low state. An idle period may have a duration, sometimes referred to as length. The duration of the total transmission time for a particular value may refer to the size of the value being transmitted or the size of the transmission. Examples of pulses used as signals include voltage changes in electrical circuits, the amplitude of electromagnetic waves in fiber optic systems, and the amplitude of acoustic waves in sound systems.

The systems and/or methods disclosed herein may be used as a protocol, (e.g., a variable pulse encoding (VPE) protocol). For example, the systems and/or methods may be used in applications similar to those using conventional protocols such as serial peripheral interface (SPI) and inter-integrated circuit ($I^2C$ or I2C). The systems and/or methods disclosed herein may replace protocols such as SPI and I2C. The systems and/or methods of the present disclosure may be beneficially used for devices requiring fast transfer of large blocks of data such as serial memory and LCD displays, for example. Use of I2C and SPI is widespread among both microcontroller and device manufacturers.

The systems and/or methods described herein may provide a high-speed, low-level, point-to-point synchronous communication protocol for device-to-device data transfer. With more and more devices sending greater amounts of data across serial interfaces, the protocol may be configured for internet-of-things applications, where one or more nodes may need to handle large data blocks quickly.

Non-limiting technical advantages of the systems and/or methods described herein may include increased data transfer speeds, reduced interface connections, no limit on size of data values transferred, or dynamic transfer speeds, or a combination thereof. Other advantages may be realized.

The VPE protocol may provide numerous benefits for low-level device communications when compared to the current industry standards. For instance, significantly faster data transfer speeds may be possible. Though data transfer speeds vary depending upon the data values being transferred, even in the worst case, the performance from VPE may be significantly better than from the SPI or I2C protocols. It is at least equal to the performance from these protocols. From comparison tests transferring images by several of these protocols, the average performance may provide a 25% to 35% reduction in transfer time without compression. When considering a uniformly distributed data set across various word sizes, a 25% improvement in transfer time for 8-bit values may be observed. The transfer time reduction may improve to 35% with 24-bit values. Built in compression methods may sometimes result in significant improvements. Using a difference compression technique that is part of the VPE protocol, experiments may show significant improvements in data transfer time with some data sets.

Unlike the SPI and I2C protocols, the VPE protocol of the present disclosure may embed timing information within the data stream. Thus there may be a single synchronous channel for communications compared with the multiple channels required by other protocols. The embedded timing information may reduce physical interface requirements and make the protocol exceptionally good for optical, acoustic, and other nonconventional signal transfer media.

The VPE communications protocol of the present disclosure may provide a fast and efficient physical layer protocol for device-to-device communications. The VPE protocol of the present disclosure may define at least part of the physical layer of the open system interconnection (OSI) model for communication. It is a unidirectional point-to-point synchronous protocol. If bidirectional communication is desired, two VPE connections can be utilized (one for the transmitter and one for the receiver). Use of two VPE connections provides high speed data throughput and predictable message latency times.

The VPE protocol may be advantageous for low-level communications when compared to other similar protocols. This is especially true as more and more data intensive functionality is integrated into smaller and smaller packages. However, other benefits may be provided.

The VPE protocol may represent data in a unique way when compared with other similar protocols. Specifically the duration of pulse codes vary depending upon the value being transmitted. Smaller values will be sent in shorter time than larger values. For instance, the value 71 will require a transmit time of 8 $t_0$ whereas the value of 1 will require only 3 $t_0$. The value $t_0$ represents the fundamental time reference for the VPE protocol. The specifics of pulse encoding are explained further in the VPE Pulse Encoding section below.

Due to the varying size of data values within the protocol, overall message size is highly variable with the transmission of smaller frames being significantly faster than larger frames. This can be advantageous for one or more non-limiting reasons, for example:

Reduction of bandwidth overhead for network management functions. For example, by reserving smaller values for numeric device addresses and command codes for network management, the speed of general network management tasks may be improved and more bandwidth may be available for application focused data transfers;

Improvement of overall data transfer speeds. For example, since smaller numbers transfer more quickly through the network, there will be a general overall improvement in the speed of total data transfer. This improvement in speed may have a significant impact when larger data blocks are transmitted. This improvement may be especially beneficial for storage devices, high-resolution display devices, or devices responsible for processing large amounts of external data.

No limits on values transmitted. For example, with conventional protocols, number size is limited to a certain bit size. The VPE protocol does not limit the size of values passed through the network. Handling data size will be moved to higher OSI layers.

No limits on number of devices attached. For example, if this protocol is used as part of a ring type multi-device network, the number of addressable devices is unlimited since there is no limit to the size of data values in the protocol. The only limit for the number of devices attached will be transmission speed and desired message latency times.

Synchronous Timing

The VPE protocol may be or comprise a synchronous protocol in which clock timing is embedded within the data encoding. Transmission timing is defined by a special pulse code called the start-of-frame pulse. Subsequent word-start pulse codes can be used to refresh/reinforce the timing established by the start of frame for large frames. Since transmission speed is set by the start-of-frame pulse, the speed can be changed dynamically to fit network conditions. This alteration of transmission speed is highly beneficial in environments where the quality of the transmission environment varies with time and location. Automotive and industrial environments are good examples of low quality environments. This dynamic adaptability also provides the opportunity to communicate through a variety of communication media as well as with a variety of technologies (including extremely fast and excessively slow ones). Overall transfer rates will ultimately be determined by the slowest device in the connection. It will be up to the data link layer to negotiate transmission speed for the connection.

Most other low level communication protocols require multiple channels/lines for transmission. The SPI and I2C protocols, for instance, require a separate channel for the clock and data signals. Since the timing is embedded in the data for the VPE protocol, only one channel/line is required for transmission. The need for routing, driving, and managing multiple channels for communication can increase device and system costs making the VPE protocol a more cost effective option for system implementation.

A few low-level communication standards similar to VPE currently exist and are used extensively in industry. However, these protocols limit the size of data transmitted to 8-bit blocks. Thus, transmitting large values is cumbersome as it requires pre and post processing for the transmitter and receiver respectively. This limitation also adds to the frame overhead thus directly impacting the true data transfer rate. The VPE protocol described herein is more flexible with data size and has limited overhead for managing each transmission.

I2C

The I2C protocol is a 2-wire protocol and expects data to be organized in discrete bytes with an acknowledgement from the receiver required for each byte transmitted within a frame. This forces larger numbers to be broken up into byte-size pieces for transfer impacting receiver/transmitter processing time and real data transmission rates. By contrast, in the VPE protocol, any size value may be transmitted thus no pre-processing or post-processing of data is necessary for transmission. This lack of overhead processing improves the overall performance of VPE when compared to I2C.

SPI

The SPI protocol is a 4-wire protocol but, for comparison purposes and in order not to distort the comparison, only one target device and single direction were considered. The SPI protocol is limited to 16-bit transfers per frame. The first 8-bits represent a command with the remaining 8-bits representing the sending/receiving of data. This limits the application of SPI making it more suitable for short device commands and not significant data transfer operations. The VPE protocol can achieve this level of functionality but provides the flexibility for significantly larger data transfers if desired.

As mentioned earlier, the SPI specification calls for a 4-wire interface but these extra wires are used for bidirectional data transfers and multi-device addressing. The VPE protocol still improves upon the SPI protocol when bidirectional communication is considered since the clock still needs to be carried in a separate wire. Also, in practice, SPI tends to be implemented as a point-to-point interface between a peripheral device such as an analog to digital converter (ADC) and a microcontroller since its multi-device interface requires extra external resources.

Image Transfer Simulation

Tests were carried out to compare SPI and I2C with VPE, as described in this disclosure. In order to test the protocol against real data, three color images were pulled from royalty-free sources and used as test data for the protocol. The protocol compares performance with both normal encoding and difference compression encoding. When difference compression encoding is used, more than twice the speed of transfer for two images and a 45% reduction in transmission time for the third image may be achieved.

TABLE 1

Results of Image Transfer Simulation

| Image | Dimensions (pixels) | Total Size (bits) | Time reduction vs. SPI | | Time reduction vs. I2C | |
|---|---|---|---|---|---|---|
| | | | Not compressed | Compressed | Not compressed | Compressed |
| 1 | (2500, 1000) | 7,500,000 | 30.8% | 52.0% | 38.5% | 57.4% |
| 2 | (3456, 2304) | 23,887,872 | 42.3% | 45.0% | 48.7% | 51.1% |
| 3 | (5184, 3456) | 53,747,712 | 49.3% | 52.5% | 55.0% | 57.7% |

Each picture used 3 layers for color encoding so the total size of data transmitted is 3 (colors) X image width (pixels) X image length (pixels).

VPE Pulse Encoding

Figure 1:
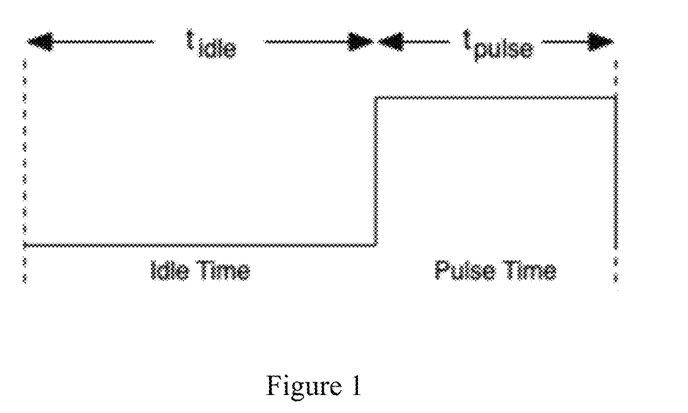
FIG. 1 shows an example pulse structure for a variable pulse encoding (VPE) protocol.

The fundamental structure of the VPE protocol utilizes a single pulse for representing a group of bits such as 2 or more bits, 4 bits, or 5 bits or larger groups of bits. Other groupings may be used. 4-Bit groups are referenced as a non-limiting example. The information contained within the pulse is represented by the width of the pulse when it is active and the time the signal is idle prior to the start of the pulse as shown in FIG. 1.

Figure 2A:
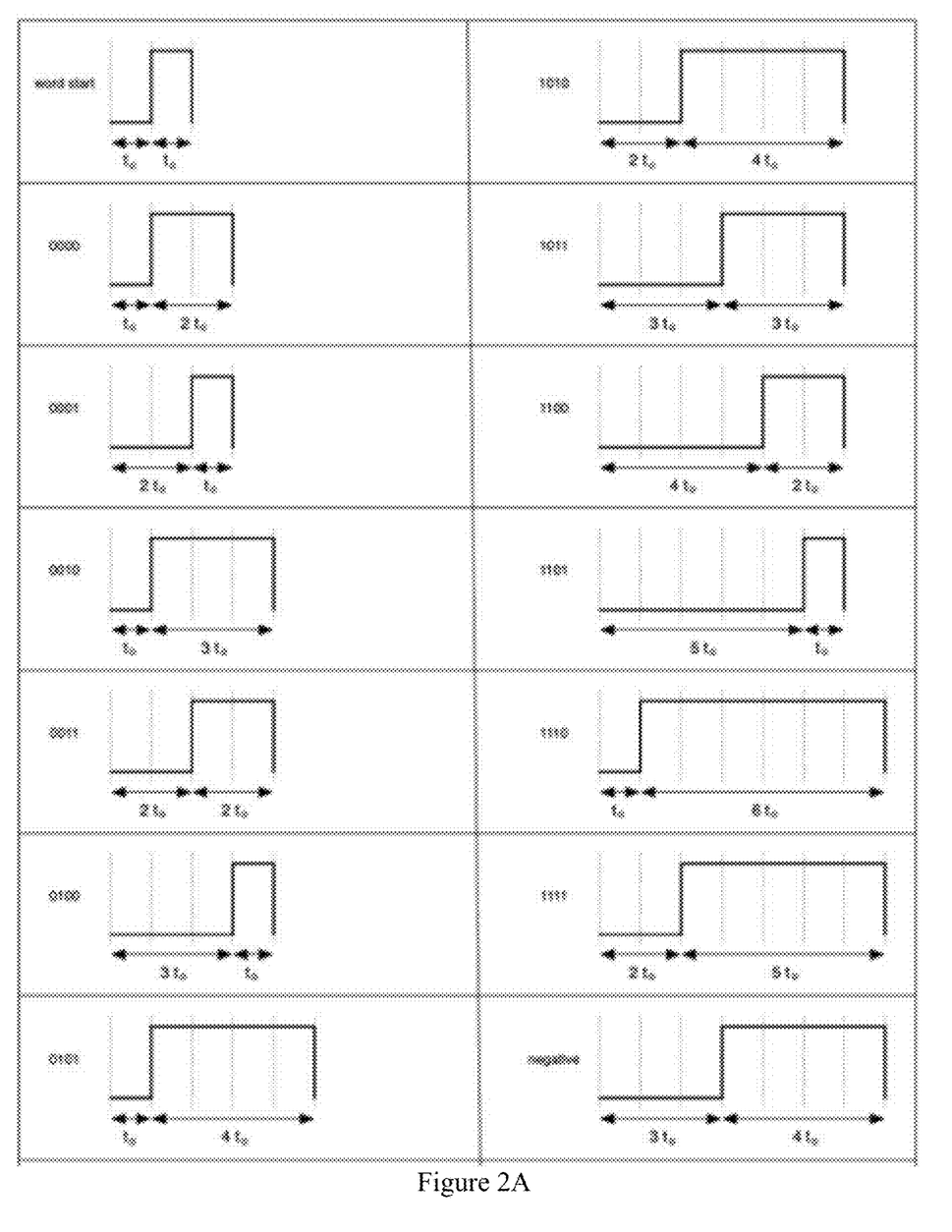
FIGS. 2A and 2B show an example pulse encoding for a VPE protocol.
Figure 2B:
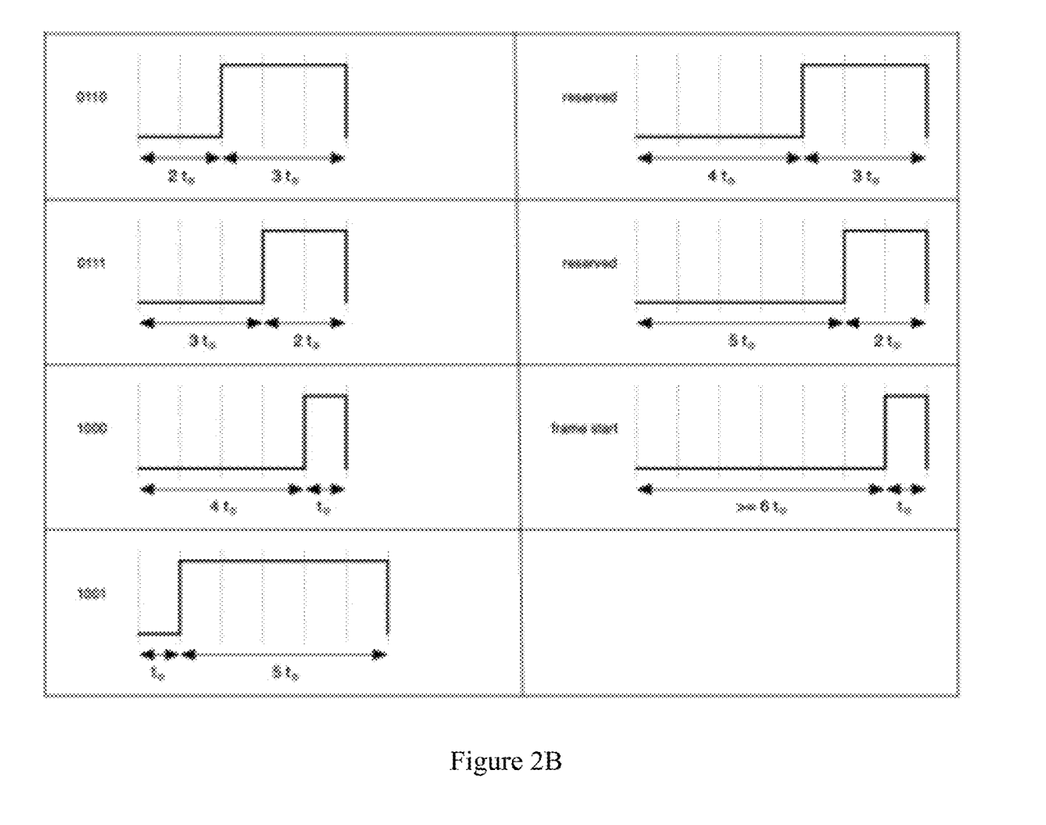

The combination of the pulse's leading idle time with the pulse width determines the value the pulse represents. FIGS. 2A and 2B present some of the possible pulse values defined in the VPE protocol and their associated meaning. The time $t_0$ represents the fundamental time length for the pulse waveforms. All pulse codes are derived as a multiple of this fundamental time length.

While the fundamental 4-bit values are illustrated in FIGS. 2A and 2B, the following are examples of special codes:

Frame Start: The frame start pulse code has two fundamental purposes. It indicates the beginning of a transmitted frame and also establishes the synchronous timing for the rest of the frame. Any pulse that begins with an idle time greater than or equal to 6 $t_0$, followed by a pulse time of $t_0$ may represent the beginning of a frame. Other thresholds or multiples of $t_0$ may be used. A word of data is expected to immediately follow the frame start pulse. The synchronous timing aspect of the frame start code was discussed in the synchronous timing section.

Word Start: The word start pulse code is used to separate word data values within the frame if more than one word is being passed in the frame. Note that this code is the shortest pulse code in the VPE protocol. This helps reduce frame management overhead. The word start pulse also provides a mechanism for resynchronizing the timing for the waveform. The synchronous timing aspect of the word start code is discussed in the synchronous timing section.

Negative: The negative pulse code is used to indicate the word value immediately following the code will represent the magnitude of a negative value. This provides a mechanism for transmitting both negative and positive values within the VPE protocol. Arguably this is not an entirely necessary code since much of the value handling can be done in the data link layer where unsigned versions of the value can be sent and this can be interpreted as a negative value on the receiver side. This does, however, contradict the notation of unlimited data size values since the data link layer would have to agree on a fixed word width for the given value.

Reserved: Two codes in the VPE protocol are reserved for later use in future implementations. In some instances, the reserved codes may be utilized for dynamic frame compression. As an example, the difference between transmitted words may be transmitted when these differences result in significantly smaller values than the actual value for transmission. As a result, transmission speed may improve but may also increase transmitter/receiver complexity. In other embodiments, this type of functionality may be implemented in the higher levels of the OSI model.

The VPE protocol obtains its timing directly from the frame start and word start pulse codes. The frame start pulse code is not simply a code where the idle time is 6 $t_0$ (or greater) and the pulse time is $t_0$. It actually serves to establish the to time for the entire frame.

Strictly speaking, the receiver is constantly looking for a situation where the received waveform has an idle time greater than or equal to 6 times the previously received pulse time. When this occurs, the receiver utilizes the pulse time to represent $t_0$ for the remainder of the frame. Subsequent word start pulse codes can then be utilized to adjust the fundamental time to for potential receiver/transmitter clock drift or receiver sampling variation due to misaligned clock phases. This will prevent sampling issues even when transmitting extremely large frames.

Another consequence of this type of waveform is the ability to dynamically adjust frame transmission speed. Since the start frame pulse code establishes timing for the frame, timing of a transfer may be continuously adjusted to optimize transmission speed for a variety of media even as medium conditions change.

Data Frame Structure

Figure 3:
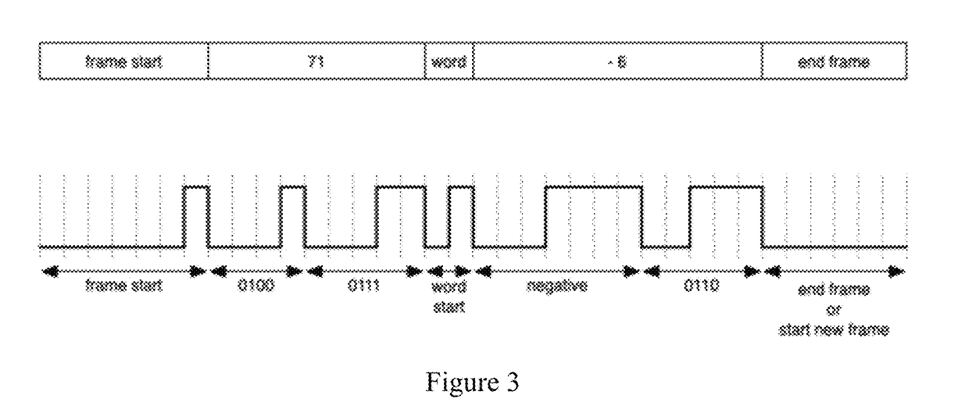
FIG. 3 shows an example VPE frame.

A complete data frame consists of a start frame pulse code followed by one or more data words. After the first data word, subsequent data words (e.g., second data word, third data word, etc.) may be separated by a start word pulse code. FIG. 3 shows the structure of an example frame transmission. The example includes both a positive and negative value for reference.

In the example frame shown in FIG. 3, the data is sent with the most significant 4-bit nibble first. In principle, the least significant bit could be transmitted first instead. There is no end frame pulse code in this example. Lack of an end frame pulse code means that the transmitter can either remain in the idle state indefinitely after transmitting the last word of the frame or a start frame pulse code can immediately follow the last word transmitted. Managing the end of frame in this fashion reduces frame handling overhead and allows for the quickest possible transmission of multiple frames.

As mentioned above, the VPE protocol may be utilized in Internet of things (IoT) applications, or other applications using low-level high-speed device networks. The VPE protocol may provide modularity for such IoT applications, particularly with respect to sensor/display interfaces. While not replacing Wi-Fi networks, the VPE protocol may significantly improve data transfer between attached devices at each IoT node where large blocks of data need to be transferred.

As an example, the VPE may be used in fields such as power bus management, sensors, displays, motor controllers, memory storage, etc.

Figure 4:
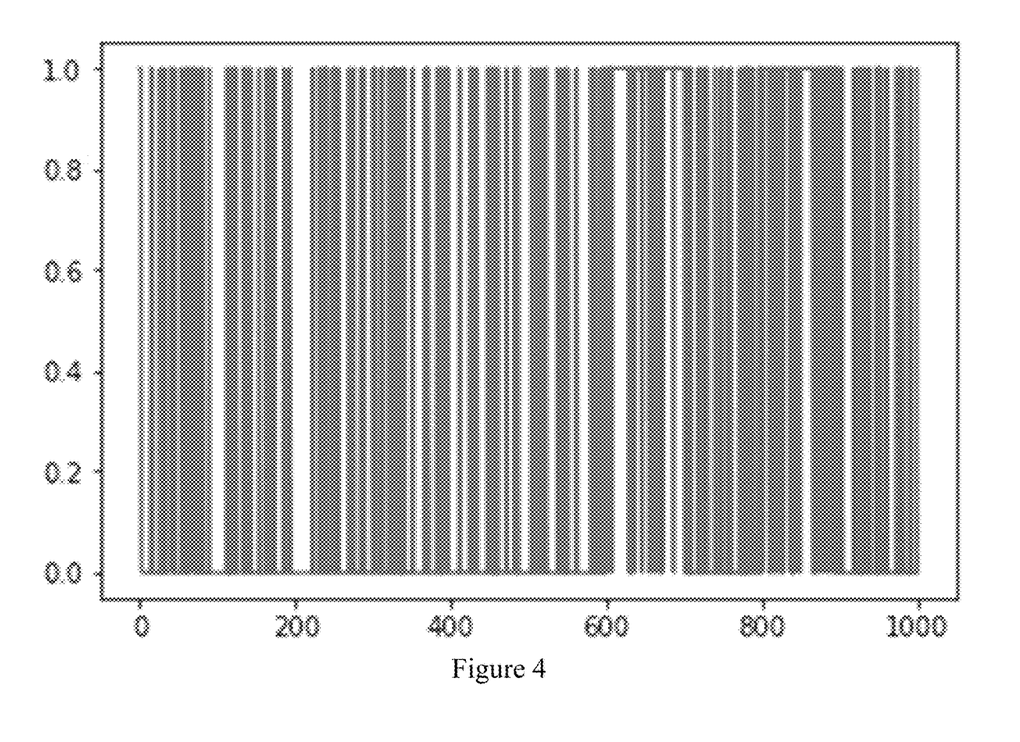
FIG. 4 shows an example waveform with noise resulting in 10% random sampling failure (10% of the receiver samples are incorrect).
Figure 5:
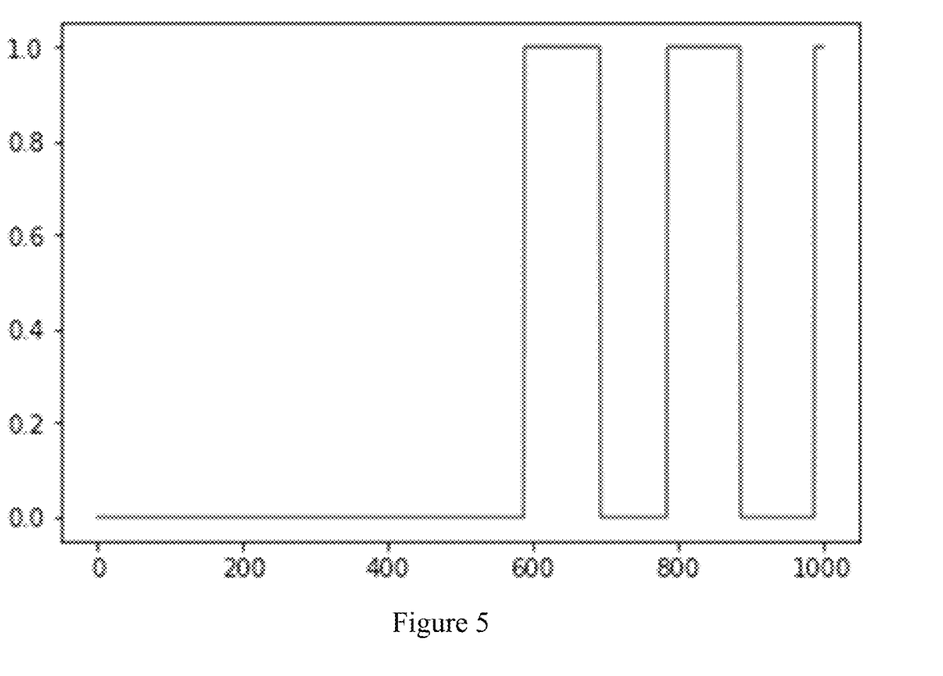
FIG. 5 shows a recovered VPE pulse stream.

As a further example, the present systems and methods may be configured to be used in or with device technologies that require a significant amount of data transferred. Devices such as small high resolution displays for handheld devices and large memories for storing vast amounts of data. These devices will work well with the VPE protocol but will put a significant strain on current low level serial networks such as I2C. VPE has performed well in simulations of recovering a pulse transmission in the presence of noise. Simulations were conducted of a waveform with randomly generated noise. FIG. 4 shows an example waveform with noise resulting in 10% random sampling failure (10% of the receiver samples are incorrect). FIG. 5 shows the recovered pulse stream. In such simulation, the original VPE pulse was completely recovered demonstrating positive noise rejection characteristics.

What is claimed is:

1. A method for transmitting information using a pulse, the method comprising:
    transmitting, via a channel between a first device and a second device, an idle state for a select idle time;
    transmitting, via the channel, a pulse state for a select pulse time;
    transmitting a second idle state and a second pulse state indicative of a second data word, wherein the select idle time and the select pulse time define a value for a data word being transmitted, wherein each of the data word and the second data word is separated by a pulse sequence indicating a word start, and wherein a duration of one or more of the select idle time and the select pulse time vary depending upon the value of the data word.

2. The method of claim 1, further comprising transmitting, via the channel, a pulse sequence indicative of a frame start signal prior to the data word.

3. The method of claim 1, wherein the word start comprises an idle time of a fundamental time length followed immediately by a pulse of the fundamental time length.

4. The method of claim 1, wherein a most significant bit is transmitted first.

5. The method of claim 1, wherein a least significant bit is transmitted first.

6. The method of claim 1, wherein each of the select idle time and the select pulse time is an integral multiple of a fundamental time length.

7. The method of claim 1, further comprising transmitting a second idle state and a second pulse state indicative of a second data word, wherein each of the select idle time and the select pulse time is an integral multiple of a fundamental time length, and wherein the fundamental time length may vary in length between data frames.

8. The method of claim 1, further comprising transmitting, via the channel, a pulse sequence indicative of a frame start signal prior to the data word, wherein each of the select idle time and the select pulse time is an integral multiple of a fundamental time length, and wherein the frame start signal comprises an idle time at least 6 times the fundamental time length followed immediately by a pulse of the fundamental time length.

9. The method of claim 1, wherein the data word comprises more than 4 bits.

10. The method of claim 1, wherein the data word comprises more than 8 bits.

11. A system for transmitting data comprising:
a transmitter;
a receiver;
at least one channel providing communication between the transmitter and the receiver; and
a data protocol configured to control transmission of data between the transmitter and the receiver, wherein the data protocol comprises:
an idle time duration;
a pulse time duration;
at least one data word encoded by the idle time and the pulse time; and
a signal indicating a frame start; and
a word start preceding the at least one data word, wherein the word start comprises an idle time of a fundamental time length followed immediately by a pulse of the fundamental time length.

12. The system of claim 11, wherein each of the idle time duration and the pulse time duration is an integral multiples of a fundamental time length.

13. The system of claim 11, wherein the at least one data word comprises more than 4 bits.

14. The system of claim 11, wherein the at least one data word comprises more than 8 bits.

15. A data protocol configured to control transmission of data in device to device communication, the data protocol comprising:
a signal indicating a frame start;
an idle state having an idle time duration;
a pulse state having a pulse time duration; and
a word start preceding at least one data word,
wherein the word start comprises an idle time of a fundamental time length followed immediately by a pulse of the fundamental time length,
wherein the at least one data word is encoded by the idle state and the pulse state, and
wherein one or more of the idle time duration and the pulse time duration vary depending upon the value of the at least one data word.

16. The data protocol of claim 15, wherein the at least one data word comprises more than 8 bits.

17. A method for transmitting information using a pulse, the method comprising:
transmitting, via a channel between a first device and a second device, an idle state for a select idle time;
transmitting, via the channel, a pulse state for a select pulse time;
transmitting a second idle state and a second pulse state indicative of a second data word, wherein the select idle time and the select pulse time define a value for a data word being transmitted, wherein a duration of one or more of the select idle time and the select pulse time vary depending upon the value of the data word, wherein each of the select idle time and the select pulse time is an integral multiple of a fundamental time length, and wherein the fundamental time length may vary in length between data frames.

18. A method for transmitting information using a pulse, the method comprising:
transmitting, via a channel between a first device and a second device, an idle state for a select idle time;
transmitting, via the channel, a pulse state for a select pulse time;
transmitting, via the channel, a pulse sequence indicative of a frame start signal prior to the data word,
wherein the select idle time and the select pulse time define a value for a data word being transmitted, wherein a duration of one or more of the select idle time and the select pulse time vary depending upon the value of the data word, wherein each of the select idle time and the select pulse time is an integral multiple of a fundamental time length, and wherein the frame start signal comprises an idle time at least 6 times the fundamental time length followed immediately by a pulse of the fundamental time length..

\* \* \* \* \*